US009999155B2

United States Patent
Brooks et al.

(10) Patent No.: US 9,999,155 B2
(45) Date of Patent: Jun. 12, 2018

(54) TAILORING AIR COOLED HEAT EXCHANGER GEOMETRY TO ACHIEVE ENVIRONMENTAL PROTECTION

(71) Applicant: Raytheon Company, Waltham, MA (US)

(72) Inventors: David A. Brooks, Holden, MA (US); Joseph R. Ellsworth, Worcester, MA (US); Costas Karageorgis, Milton, MA (US); Corey R. DeLisle, Fitchburg, MA (US); Joseph M. Crowder, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 126 days.

(21) Appl. No.: 14/995,051

(22) Filed: Jan. 13, 2016

(65) Prior Publication Data
US 2016/0205806 A1    Jul. 14, 2016

Related U.S. Application Data

(60) Provisional application No. 62/102,961, filed on Jan. 13, 2015.

(51) Int. Cl.
*F28F 7/00* (2006.01)
*H05K 7/20* (2006.01)
(Continued)

(52) U.S. Cl.
CPC .......... *H05K 7/20163* (2013.01); *F28F 1/04* (2013.01); *F28F 1/40* (2013.01); *F28F 19/02* (2013.01);
(Continued)

(58) Field of Classification Search
CPC .......... H05K 7/20163; F28F 1/04; F28F 1/40; F28F 19/02; H01L 23/467; H01L 2924/0002
See application file for complete search history.

(56) References Cited

U.S. PATENT DOCUMENTS 3,585,120 A      6/1971   Wehrmann et al.
6,135,129 A  *  10/2000   Akazawa .............. B08B 9/0436
                                                                134/8
(Continued)

FOREIGN PATENT DOCUMENTS

DE        19641155        4/1998
DE      202013100338      8/2013

OTHER PUBLICATIONS

International Search Report and Written Opinion issued for PCT/US2016/013261 dated Apr. 7, 2016, 12 pgs.

*Primary Examiner* — Len Tran
*Assistant Examiner* — Gordon Jones (57) ABSTRACT

An air-cooled heat exchanger includes a housing having an intake for air flowing through the housing and at least one outlet for the air flowing through the housing. A set of segmented fins extend within the housing between the intake and the at least one outlet, configured to direct the air flowing through the housing. Each segment of the segmented fins has a length selected based on a throw distance for an environmental protection coating process employed to apply an environmental protection coating to surfaces of the fin segments. Access ports extend through at least one wall of the housing at locations allowing connection, when the access ports are unblocked, of electrical conductors used in the environmental protection coating process to both ends of each of the fin segments. Access port covers block each of the access ports during operation of the air-cooled heat exchanger.

20 Claims, 8 Drawing Sheets

(51) Int. Cl.
  *F28F 1/04*    (2006.01)
  *F28F 1/40*    (2006.01)
  *F28F 19/02*   (2006.01)
  *H01L 23/467*  (2006.01)

(52) U.S. Cl.
  CPC .... *H01L 23/467* (2013.01); *H01L 2924/0002* (2013.01)

(56) References Cited

U.S. PATENT DOCUMENTS

| | | | |
|---|---|---|---|
| 2002/0186534 A1* | 12/2002 | Sakaiya | H05K 7/20163 361/697 |
| 2002/0195496 A1* | 12/2002 | Tsikos | B82Y 15/00 235/462.01 |
| 2010/0157531 A1* | 6/2010 | Mason | H01Q 1/02 361/697 |
| 2011/0188205 A1 | 8/2011 | MacManus et al. | |
| 2012/0006523 A1 | 1/2012 | Masahiro et al. | |
| 2012/0014066 A1 | 1/2012 | Morino et al. | |

\* cited by examiner

TAILORING AIR COOLED HEAT EXCHANGER GEOMETRY TO ACHIEVE ENVIRONMENTAL PROTECTION

PRIORITY CLAIM

This application claims priority to U.S. Provisional Patent Application No. 62/102,961 filed Jan. 13, 2015 and entitled "METHOD FOR TAILORING AIR-COOLED HEAT EXCHANGER GEOMETRIES AND ASSOCIATED HEAT EXCHANGERS." The content of the above-identified patent document is incorporated herein by reference.

TECHNICAL FIELD

The present disclosure is directed in general to thermal management systems including air-cooled heat exchangers, and, more particularly, to tailoring air-cooled heat exchanger geometries and associated heat exchangers to processes for protecting heat exchanger surfaces.

BACKGROUND OF THE DISCLOSURE

High-power radar systems and similar high-power systems often generate a large amount of heat, necessitating the use of a thermal management system to dissipate that heat. Air cooling (use of flowing air directed over heat dissipation surfaces within the high-power system) is often employed to transfer heat away from the system. In some applications, air-cooling heat dissipation devices need robust environmental protection in order to operate correctly over a desired period of time while providing efficient thermal management.

SUMMARY OF THE DISCLOSURE

An air-cooled heat exchanger includes a housing having an intake for air flowing through the housing and at least one outlet for the air flowing through the housing. A set of segmented fins extend within the housing between the intake and at least one outlet, configured to direct the air flowing through the housing. Each segment of the segmented fins has a length selected based on a throw distance for an environmental protection coating process employed to apply an environmental protection coating to surfaces of the fin segments. Access ports extend through at least one wall of the housing in between each fin segment. When the access ports are unblocked, connection of electrical conductors used in the environmental protection coating process to both ends of each of the fin segments is permitted. Access port covers block each of the access ports during operation of the air-cooled heat exchanger. The housing may have a high air flow aspect ratio. A distance between the intake and the at least one outlet may be greater than the throw distance for the environmental protection coating process employed to apply the environmental protection coating to the surfaces of the fin segments. A gap distance between adjacent ends of two successive fin segments is preferably sufficiently large to allow connection of the conductor to multiple locations along a height of one of the two successive fin segments. Each of the segmented fins may include a plurality of successive fin segments between the intake and the at least one outlet. A lateral spacing between fin segments at a first location along a length of the housing may be greater than a lateral spacing between fin segments at a second location along the length of the housing, where the first location is closer to the intake than the second location. The fins may be fully segmented, and the access ports may each extend through a single wall of the housing. A high-power radar array includes a plurality of the air-cooled heat exchangers mounted within a radar housing, with electronic components mounted in the radar housing in contact with an external surface of at least one of the first and second air-cooled heat exchangers.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below. Additionally, unless otherwise specifically noted, articles depicted in the drawings are not necessarily drawn to scale.

As noted above, high-power systems often use thermal management systems to cool electronic components. Thermal management systems that use air cooling typically direct flows of air through heat exchangers to transfer heat away from heat dissipation surfaces within the system. In some environments, robust environmental protection of the surfaces over which the air flows is required. For example, in applications for which surfaces are likely to be exposed to salt air, corrosion-protection coatings to inhibit corrosion by the salt air are desirable. Chromate conversion coating (also referred to as "chromating") and similar methods can be used to coat metallic structures including the heat dissipation surfaces within heat exchangers. However, chromating and similar types of corrosion-protection approaches often do not provide adequate protection against harsh environments that can be experienced by high-power systems, such as battlefield conditions.

Electro-coating refers to a process where an object is placed in a liquid medium containing colloidal particles. An electrical charge is applied to the object, causing the colloidal particles to be deposited onto the object. Among other uses, electro-coating can be used to create a thin coating layer on the object. As an example, conductive particles can be deposited onto a heat exchanger to form a protective coating over the heat exchanger. Electro-coatings of this type (e.g., a flexible epoxy polymer electro-coating) may provide robust environmental protection without meaningful degradation of thermal performance, which cannot be achieved with other coatings such as chromate.

Electro-coating is routinely used with heat exchangers having short flow lengths and large flow areas. The air flow "aspect ratio" of a heat exchanger is defined as the flow length of the heat exchanger divided by the cross-sectional area of the heat exchanger, so heat exchangers having short flow lengths and large flow areas have low air flow aspect ratios (e.g., typically much less than 1). Heat exchangers with low aspect ratios are, for example, routinely used in the heating, ventilating, and air conditioning (HVAC) industry. Unfortunately, conventional electro-coating techniques cannot be applied to heat exchangers having high air flow aspect ratios (at least 1). More specifically, the maximum distance over which an electro-coating can be applied to internal surfaces of a heat exchanger is approximately 5-15 inches, depending on the internal structure of the heat exchanger and assuming the interior of the heat exchanger is accessible from both ends. The inability to form electro-coatings over longer distances prevents the application of electro-coatings within heat exchangers having high aspect ratios.

In accordance with this disclosure, a heat exchanger with a high aspect ratio is provided. Air can flow through the heat exchanger to remove heat from a high-power radar system or other system. At least the internal surfaces of the heat exchanger (such as the surfaces of fins or other structures within an interior of the heat exchanger) are covered by an electro-coating to provide robust environmental protection.

Figure 1:
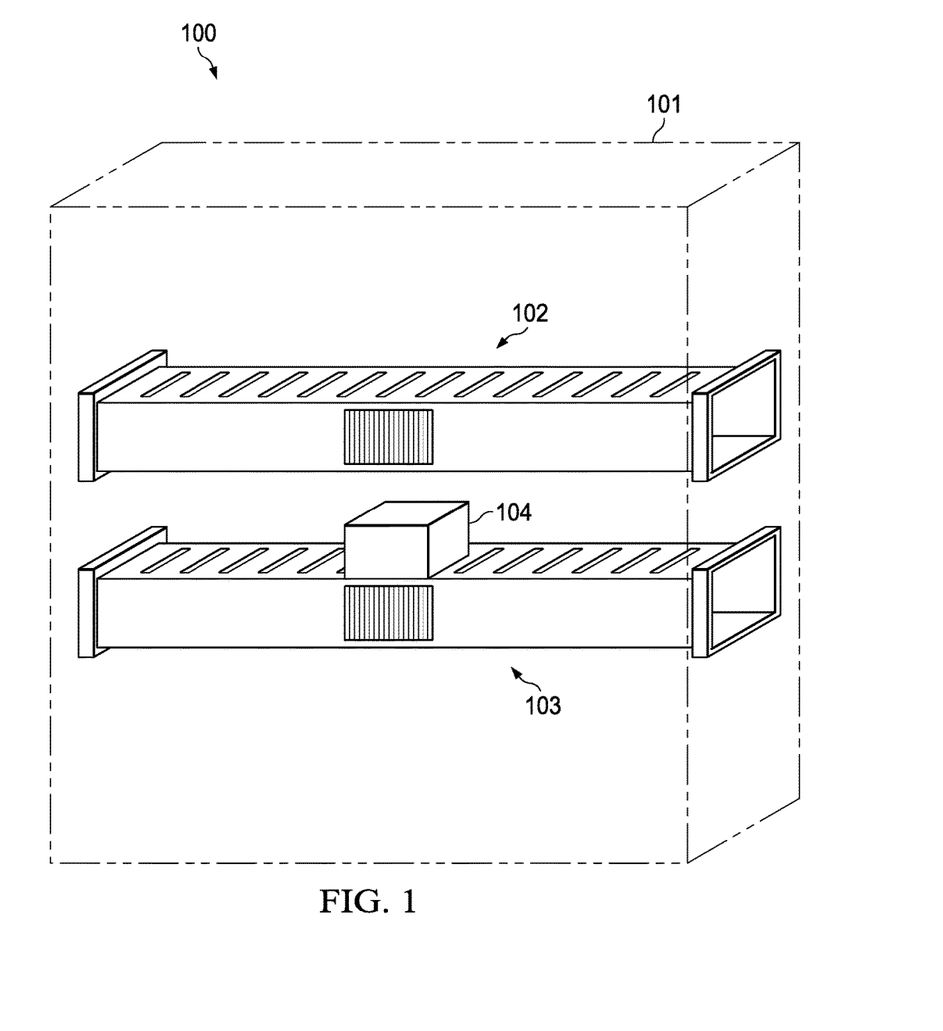
FIG. 1 is a simplified diagram illustrating a high-power system including air cooled heat exchangers each having a geometry allowing environmental protection to be provided by electro-coating in accordance with embodiments of the present disclosure.

FIG. 1 is a simplified diagram illustrating a high-power system including air cooled heat exchangers each having a geometry allowing environmental protection to be provided by electro-coating in accordance with embodiments of the present disclosure. The high-power system 100 may comprise, for example, a radar array contained within a housing 101. Air-cooled heat exchangers 102 and 103 are mounted within the housing 101 to facilitate dissipation of heat produced by operation of the electronic components for the high-power system 100. In the example shown, the high-power system 100 includes a plurality of air-cooled heat exchangers 102 and 103. In alternate embodiments, however, the high-power system may include only a single air-cooled heat exchanger of the type described below, or may include more than the two air-cooled heat exchangers 102 and 103 depicted. For example, a given high-power system might include a series of eight vertically spaced air-cooled heat exchangers of the type described below mounted within the housing of that system, for cooling electronic components.

Electronic components (not shown in FIG. 1) for the high-power system 100 are mounted adjacent to the air-cooled heat exchangers 102 and 103, with heat sinks for the electronic components in contact with external surfaces of the air-cooled heat exchangers 102 and 103. For example, electronic components may be mounted in between the air-cooled heat exchangers 102 and 103 depicted in FIG. 1, with heat sinks in contact with the bottom external surface of the air-cooled heat exchanger 102 and in contact with the top external surface of the air-cooled heat exchanger 103. Additional electronic components may also be mounted with heat sinks in contact to the top external surface of the air-cooled heat exchanger 102, and still further electronic components may be mounted with heat sinks in contact with the bottom external surface of the air-cooled heat exchanger 103. In a high-power system with more than the two air-cooled heat exchangers 102 and 103 depicted in FIG. 1, electronic components may be mounted above, below, and/or between any of the air-cooled heat exchangers.

Figure 2:
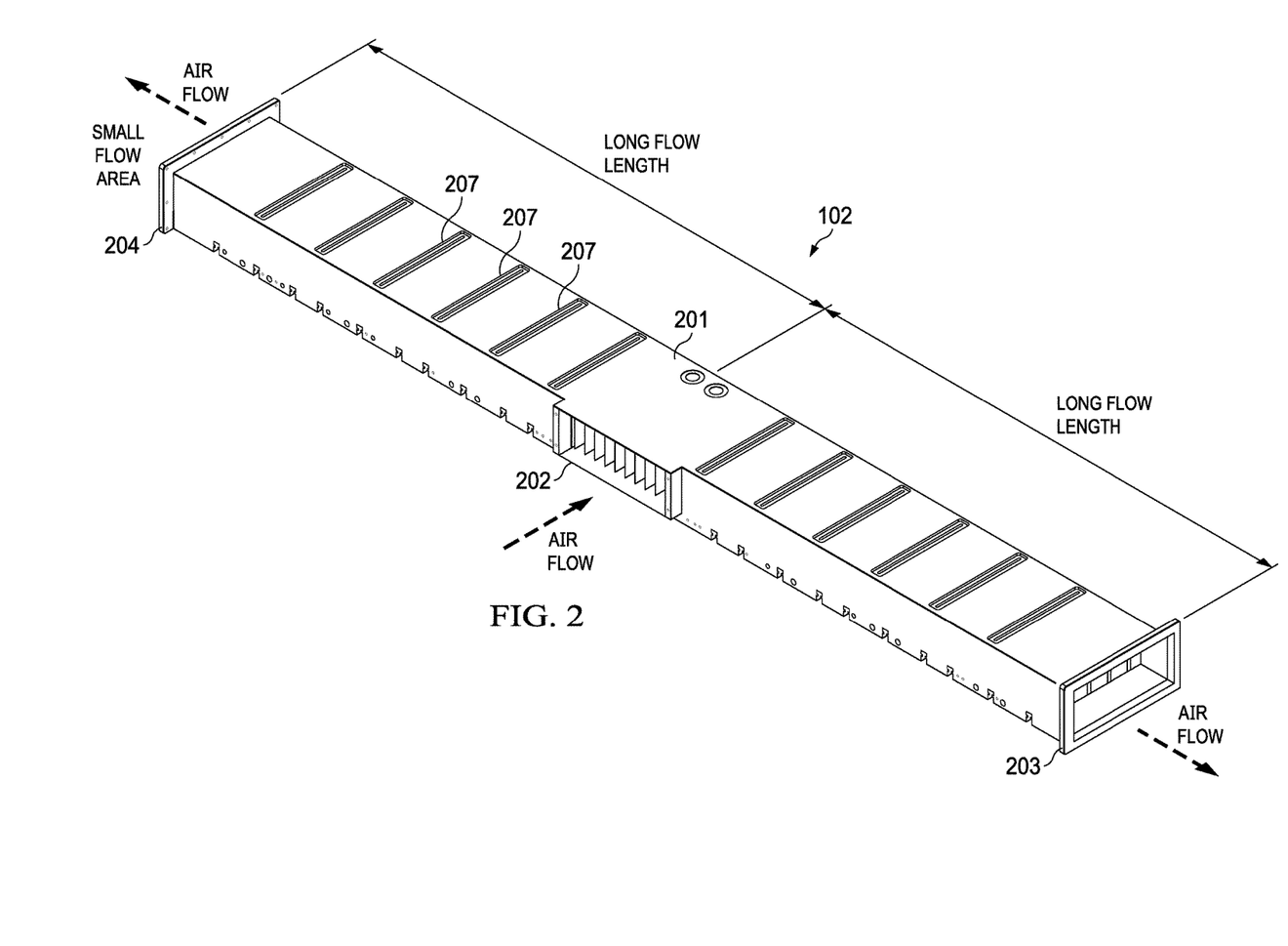
FIG. 2 is a perspective view of an air-cooled heat exchanger having a geometry allowing environmental protection to be provided by electro-coating in accordance with embodiments of the present disclosure.
Figure 2A:
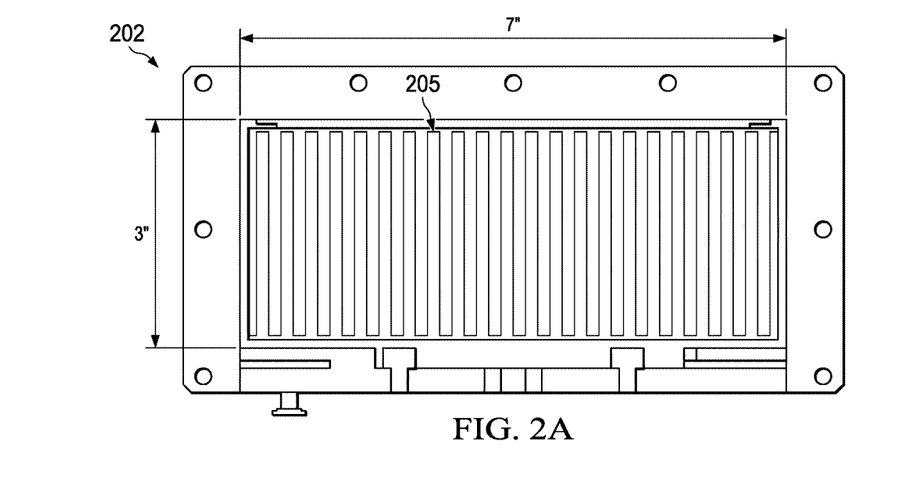
FIG. 2A is a front view of the intake portion of the air-cooled heat exchanger of FIG. 2.
Figure 2B:
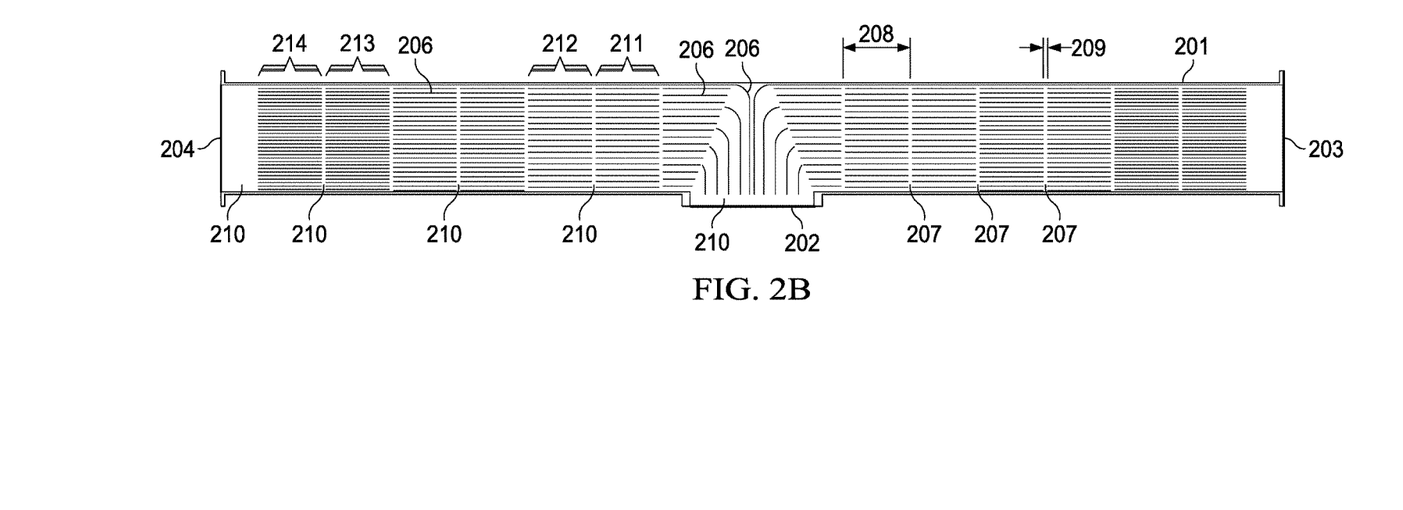
FIG. 2B is a sectional plan view taken along a length of the air-cooled heat exchanger of FIG. 2.

FIG. 2 is a perspective view of an air-cooled heat exchanger having a geometry allowing environmental protection to be provided by electro-coating in accordance with embodiments of the present disclosure. FIG. 2A is a front view of the intake portion of the air-cooled heat exchanger of FIG. 2, and FIG. 2B is a sectional plan view taken along a length of the air-cooled heat exchanger of FIG. 2. The air-cooled heat exchanger 102 includes an elongate housing 201 having a hollow rectangular cross-section. A centrally located intake 202 into the interior of the housing 201 allows ambient air to be drawn into the air-cooled heat exchanger 102. Two outlets 203 and 204 at opposite ends of the housing 201 permit air to be drawn or expelled from the interior of the air-cooled heat exchanger 102. In the exemplary embodiment described, exhaust fans positioned proximate to the outlets 203 and 204 draw air from the interior of housing 201. The resulting pressure differential causes air to be drawn into the housing 201 at the intake 202, establishing air flows into the intake 202 through the interior of housing 201 and out of the outlets 203 and 204. Visible through the opening of intake 202 in FIGS. 2 and 2A are the intake ends 205 of fins 206 inside the interior of the housing 201, which direct the air flow within the interior of the housing 201 and provide additional cooling surfaces. The fins 206 are vertically disposed in the direction of a height of the housing 201 and preferably extend across an entire distance, or substantially all of the entire distance, of an internal height of the interior of housing 201. Laterally, the fins 206 extend initially from the opening of intake 202 transverse to a length of the housing 201, across a width of the housing 201. At different distances from the opening of intake 202, each of the fins 206 curves to extend in a direction along the length of the housing 201, and extends (except for the gaps described below) substantially along a length of the housing 201. The fins 206 form sidewalls of air passages in the interior of housing 201, directing air flows from the intake 202 to the outlets 203 and 204 and, as noted above, providing addition heat dissipation surfaces.

As illustrated, the air-cooled heat exchanger 102 has a relatively high aspect ratio. That is, the rectangular cross-sectional area of the interior of the housing 201 is small relative to the distance that air flow travels within the interior of the housing 201. For instance, in one embodiment the rectangular cross-section of the interior of the housing 201, taken transverse to the longitudinal direction of air flow out of the outlets 203 and 204, may be on the order of 2-4 inches in height by 5-7 inches in width, as compared to an overall length of about 70 inches for the housing 201 (i.e., a distance of 35 inches in either direction from the horizontal centerline of the intake 202 to the ends of the housing 201 at outlets 203 and 204). If the fins 206 extended continuously from the opening of intake 202 to a location slightly offset from the openings for the outlets 203 and 204, each fin 206 would have a linear length in excess of about 30 inches. For the reasons described above, that dimension is too long for effective electro-coating of the fins 206 for environmental protection.

To overcome the problem of limited electro-coating distances, the heat exchanger includes fins formed in multiple segments along the length of the fins, rather than continuous longer fins. In the example shown, fins 206 are segmented into lengths 208 of about 4.25 inches, with adjacent groups of segments along the length of the housing 201 separated by a gap distance 209 of about 0.25 inches. The result in the example depicted is six groups of segments for fins 206 extending inwardly from the outlets 203 and 204 (twelve groups total). Two additional groups of segments for fins 206 extend from a location proximate to the opening for intake 202 inward before curving to extend for some distance along the length of the housing 201. The gaps between successive groups of segments for fins 206 do not substantially disrupt the direction of air flows by the fins 206 and have not been found to significantly degrade thermal performance as compared to continuous length fins. It should be noted that segmentation of the fins 206 need not be complete. Stated differently, fin segments need not be completely separated by a gap along the entire height of a fin. Instead, "bridge" portions at one or more of the top, bottom, or center of the fin may extend between aligned fin segments. For example, in some embodiments it may be sufficient for a fin to be merely notched at the top and/or bottom (leaving a center bridge region) at the point of nominal segmentation. Moreover, combinations of complete segmentation at some locations along a length of the fin and partial segmentation at other locations along the length may be employed. "Segmentation" and "segment" are each used herein to refer to both full and partial segmentation and to both fully and partially separated segments, respectively.

To facilitate electro-coating of the fins 206, access ports 207 into an interior of the housing 201 from the outside are provided in one or more external surfaces of the air-cooled heat exchanger 102 at specified locations along the length of the housing 201. By preference, the access ports 207 are aligned with the gaps between the segments of the fins 206. As a result, one of the access ports 207 may be positioned at opposite ends 201 of each of the segments for fins 206. The access ports 207 extend transverse to the longitudinal direction of air flow out of outlets 203 and 204 and across substantially all of a width of the housing 201. In the exemplary embodiment depicted in FIGS. 2, 2A and 2B, the access ports 207 have a width of approximately 0.25 inches and are aligned over gaps between adjacent segment groups of fins 206. In the example of FIGS. 2, 2A and 2B, the access ports 207 all extend through a top wall of the housing 201. In other embodiments, at least some of the access ports 207 may extend through a bottom or other wall of the housing 201. For example, the access ports 207 may alternate between the top and bottom walls of the housing 201 along the direction of the length of the housing 201.

The access ports 207 allow electro-coatings to be applied within the interior of the heat exchanger 102 along the entire length of the heat exchanger 102. Conductors for the requisite electrical connections used during electro-coating may pass through the access ports 207 for connection to the end of a segment of the fins 206. For the fully segmented fins of the exemplary embodiment, connections between the conductor and the end of a fin segment may be made at multiple locations along the height of the fin segment (the 0.25 inch gap distance described above has been found sufficient for that purpose). Conductors are connected to both (i.e., opposite) ends of each fin segment to be coated by the electro-coating process. Accordingly, the locations of the access ports 207 and/or the lengths of the fin segments within the heat exchanger may be selected based on the capabilities of the electro-coating process. As noted above, the maximum "throw" distance for effective coating using currently known electro-coating processes is understood to be about 15 inches. One or both of the fin segment length and the access port separation may be selected based on that maximum throw distance. A distance from one corner of each fin segment to a diagonally opposite corner should therefore be less than 15 inches, and preferably less than about 5 inches. Access ports are preferably separated by a distance equal to the fin segment length. Of course, those skilled in the art will understand that future improvements to electro-coating processes may increase that maximum distance, and accordingly changes in fin segment length or access port separation may be possible with such improvements. In addition, electro-coating of the interior surfaces of housing 201 may occur concurrently with electro-coating of the fins 206. However, those skilled in the art will understand that the protection against corrosion of the walls for housing 201 of the air-cooled heat exchanger 102 is not as important to satisfactory long-term operation of the air-cooled heat exchanger 102 as is protection of the significantly thinner fins 206.

Figure 3A:
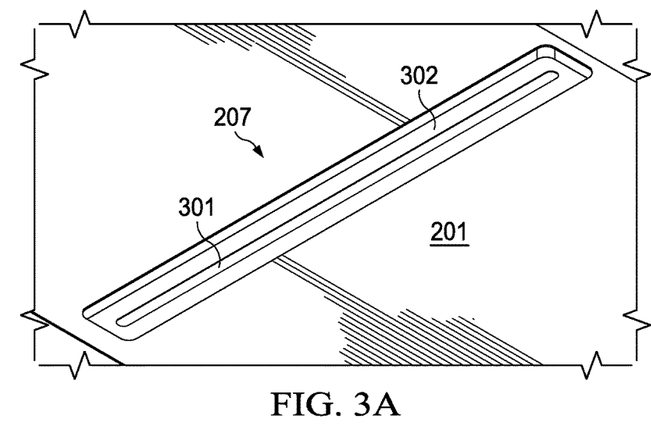
FIGS. 3A, 3B and 3C are respectively a perspective view, a plan view and a sectional view of an access port through an air-cooled heat exchanger wall facilitating environmental protection by electro-coating in accordance with embodiments of the present disclosure.
Figure 3B:
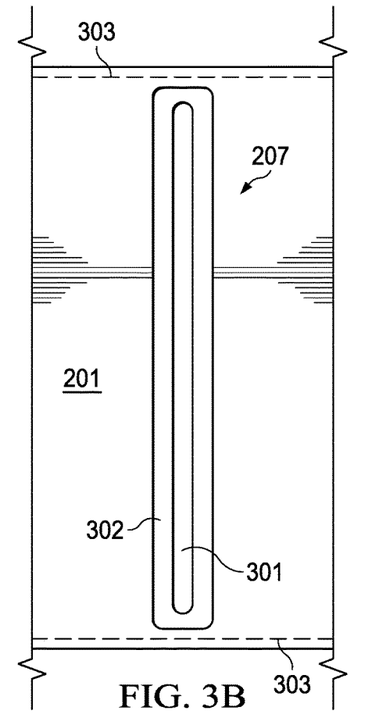
Figure 3C:
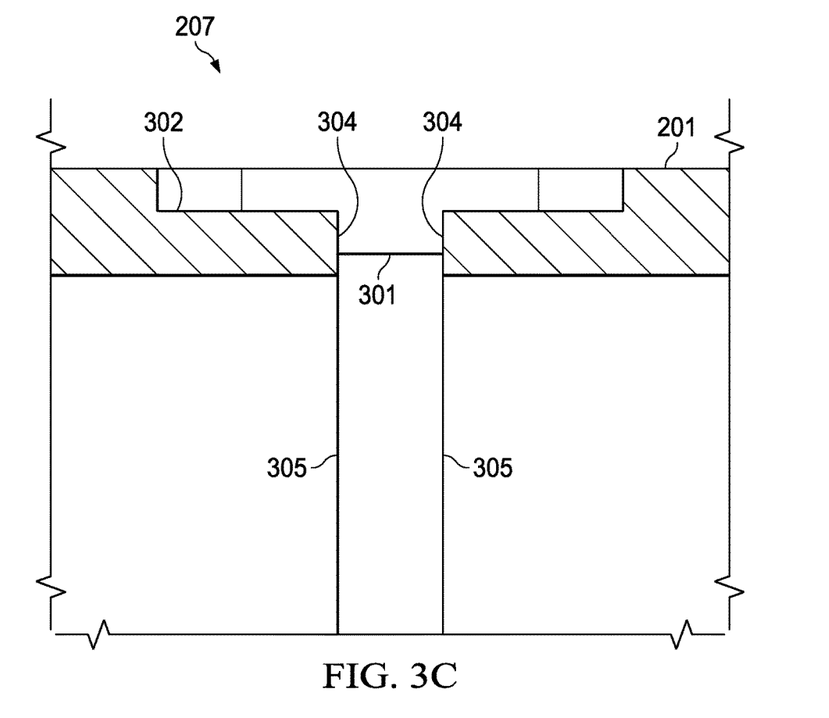

FIGS. 3A, 3B and 3C are respectively a perspective view, a plan view and a sectional view of an access port through an air-cooled heat exchanger wall facilitating environmental protection by electro-coating in accordance with embodiments of the present disclosure. Each access port 207 includes a thru slot 301 extending through the housing wall and preferably includes a blind pocket or recessed region 302 surrounding the thru slot 301 and extending partially into (i.e., partially through) the housing wall. The blind pockets 302 allow a corresponding access port cover (described in further detail below) to remain flush with the external surface of housing 201, which may be essential for tight packaging applications, and also provides a bonding area for the access port covers. To maintain structural rigidity, the ends of the thru slot 301 and blind pocket 302 are inboard of the internal surfaces 303 of the walls for housing 201. In the exemplary embodiment, the edges 304 of each access port 207 align with a gap between fin segments, and therefore with the ends 305 of the fin segments.

Figure 4A:
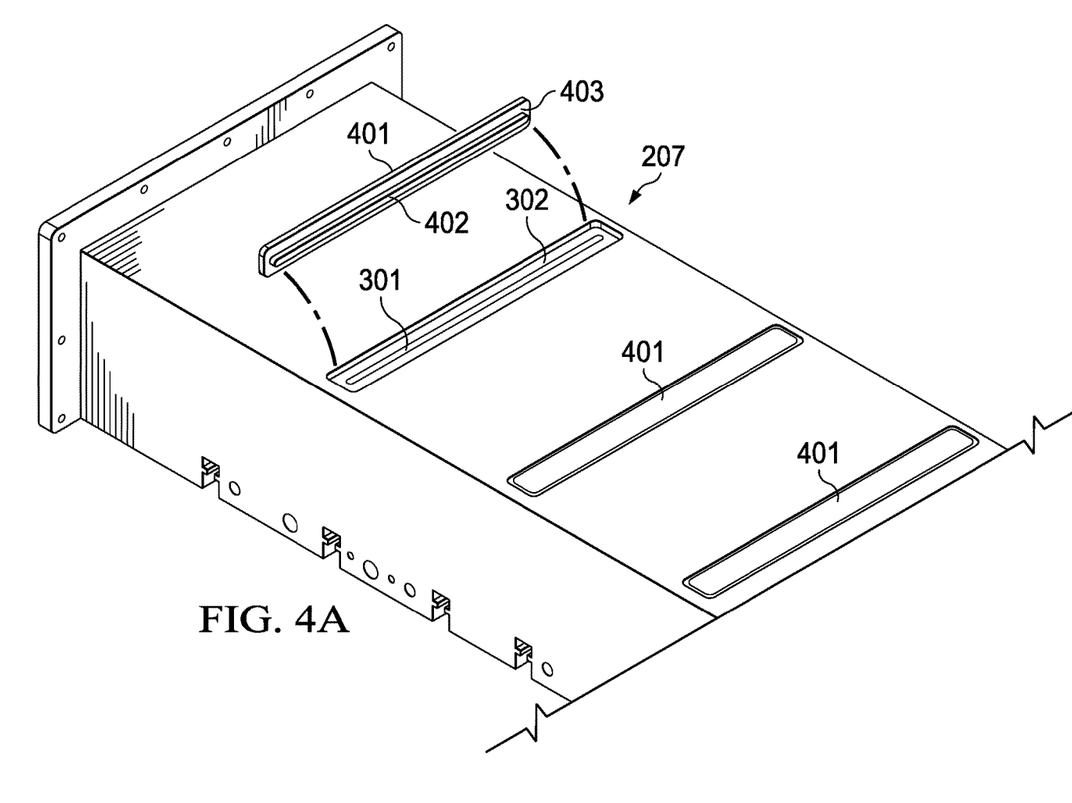
FIGS. 4A and 4B are respectively a perspective view and a sectional view of an access port cover fitted into an access port through an air-cooled heat exchanger wall facilitating environmental protection by electro-coating in accordance with embodiments of the present disclosure.
Figure 4B:
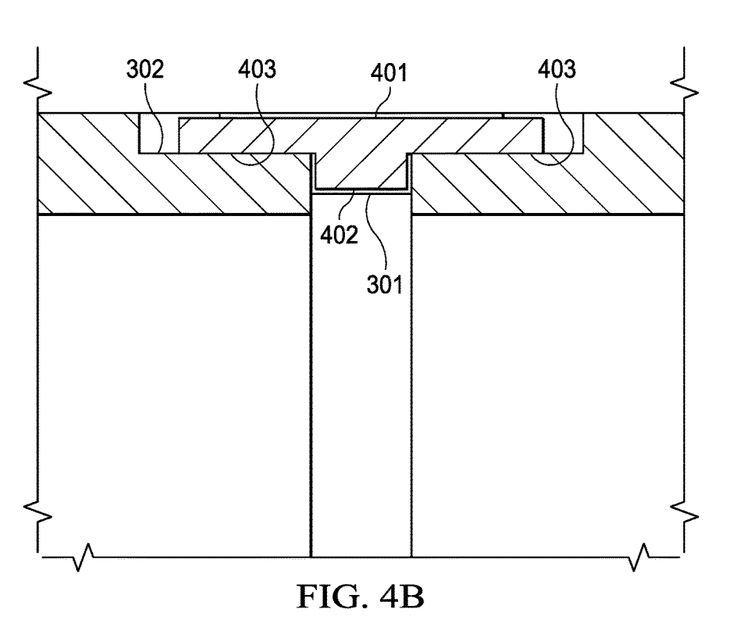

FIGS. 4A and 4B are respectively a perspective view and a sectional view of an access port cover fitted into an access port through an air-cooled heat exchanger wall facilitating environmental protection by electro-coating in accordance with embodiments of the present disclosure. Once an electro-coating has been applied along the length of the heat exchanger's interior (including interior surfaces of the housing 201 as well as surfaces of fins 206), access port covers 401 are used to seal the access ports 207 in order to substantially reduce or prevent air from leaking through the access ports 207 during operation of the heat exchanger. Each access port cover 401 has a T shaped cross-section that includes a protruding plug 402 that extends into the thru slot 301 of the access port 207 when the access port cover 401 is in place. The flanges of each access port cover 401 provide adhesion areas 403 for applying an adhesive securing the access port cover 401 over and within the respective access port 207. Each access port cover 401 has dimensions selected to substantially fill and cover the corresponding access port 207 along an entire width and length thereof. The thickness dimensions of the access port cover 401 is selected based on the depth of the blind pockets 302 and the wall thickness for housing 201, so that the upper surface of the access port cover 401 is substantially flush with an external surface of housing 201 and an end of the plug 402 is substantially flush with an internal surface of the housing 201. This results in an air-cooled heat exchanger 102 that is fully electro-coated along interior surfaces of internal fins 206 to provide robust environmental protection to such fins while maintaining high thermal performance of the air-cooled heat exchanger 102.

Referring once again to FIG. 2B, one benefit of fully segmenting the fins 206 as described herein is to allow variable fin pitch or density along a length of the air-cooled heat exchanger 102. Cool or chilled air enters the air-cooled heat exchanger 102 at a first average temperature suitable for cooling the electronic components. As the air passes through the length of the air-cooled heat exchanger 102, however, heat is transferred to the air, which is accordingly warmed to a higher temperature. The air passing through the air-cooled heat exchanger 102 therefore attains a temperature at the outlets 203 and 204 that may be significantly higher than the air temperature at the intake 202. As the temperature difference between a heat dissipation surface (e.g., a portion of the interior surface of housing 201) and the air flowing over that surface decreases, the cooling effect produced by the passing air drops. As a result, the cooling provided by the air-cooled heat exchanger 102 near the outlets 203 and 204 may be significantly less than cooling provided by the air-cooled heat exchanger 102 near the intake 202. To equalize the cooling at different locations along a length of the air-cooled heat exchanger 102, the pitch (lateral distance or spacing between) or density (number per unit length across the housing width) of the fins 206 may differ for different groups of fin segments. More fin segments (lower fin pitch, higher fin density) provides greater total heat dissipation surface area, improving cooling. By providing more fins where more cooling is required, equalization of cooling along the length of housing 201 may be improved. Thus, for example, a higher fin pitch and lower fin density may be used for one or both of groups 211 and 212 of fin segments near the intake 202 than for groups 213 and 214 near the outlet 204. In addition, more fins 206 may be provided in areas along the length of housing 201 that are adjacent electronic components requiring greater cooling capacity (i.e., producing more heat) than others of the electronic components being cooled.

Figure 5:
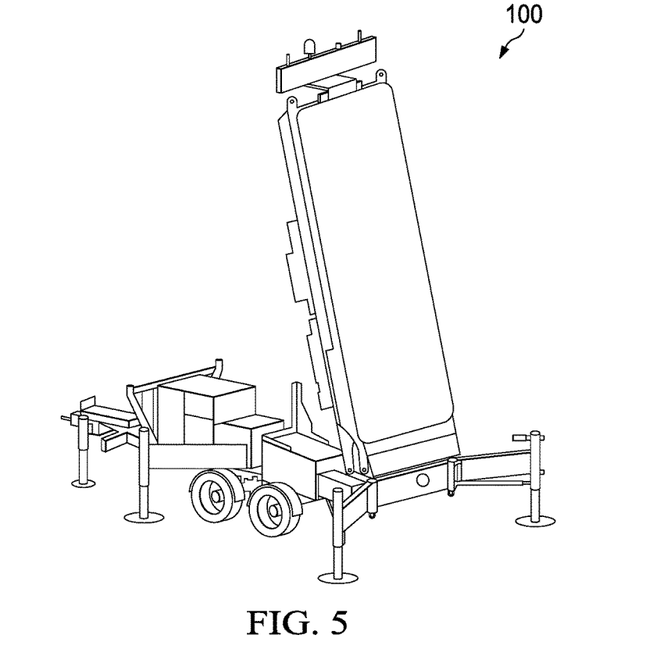
FIG. 5 illustrates a high-power radar array system including housing within which electronic component(s) are mounted in contact with an external surface of at least one air-cooled heat exchanger in accordance with embodiments of the present disclosure.

FIG. 5 illustrates a high-power radar array system 100 including housing 101 within which electronic component(s) are mounted in contact with an external surface of at least one air-cooled heat exchanger in accordance with embodiments of the present disclosure. Air-cooled heat exchangers 102 and 103 are mounted within the housing 101 as shown in FIG. 1 to facilitate dissipation of heat produced by operation of the electronic component(s) 104 for the high-power radar array system 100 that are mounted in the radar housing in contact with an external surface of at least one of the air-cooled heat exchangers 102 and 103.

Figure 6:
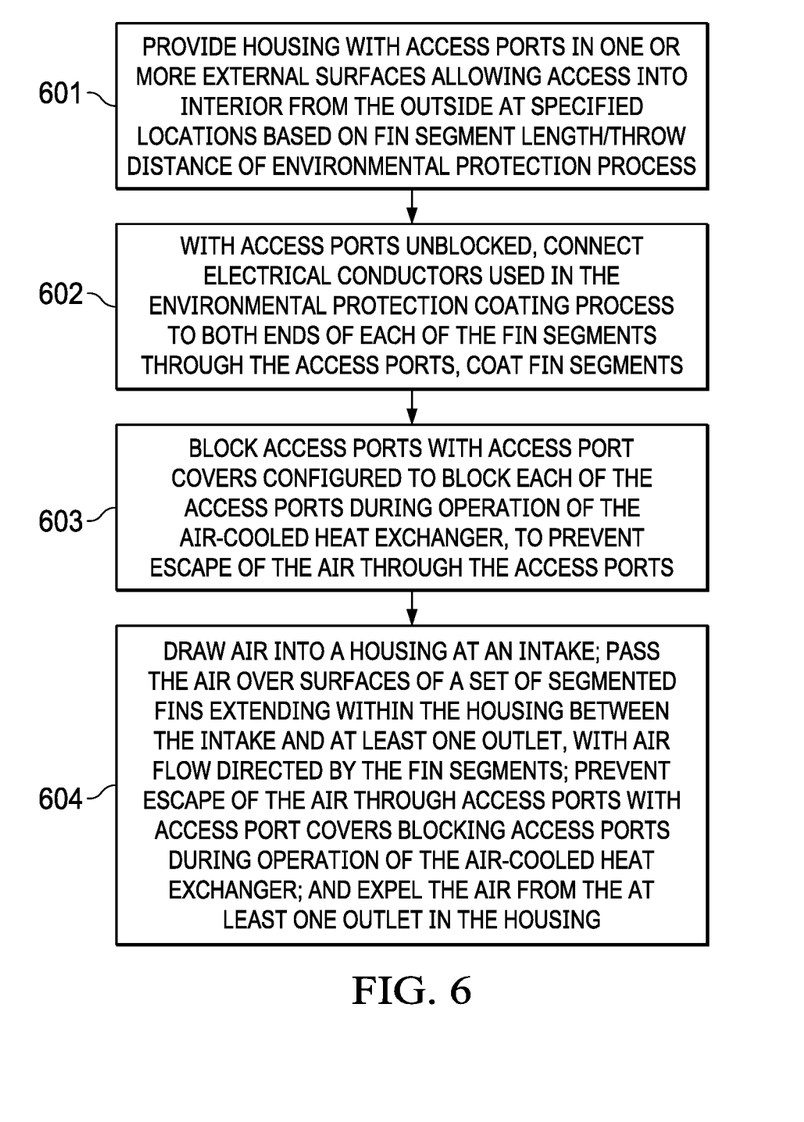
FIG. 6 is a high level flow diagram for a method of forming and then operating a high-power system including air cooled heat exchangers each having a geometry allowing environmental protection to be provided by electro-coating in accordance with embodiments of the present disclosure.

FIG. 6 is a high level flow diagram for a method of forming and then operating a high-power system including air cooled heat exchangers each having a geometry allowing environmental protection to be provided by electro-coating in accordance with embodiments of the present disclosure. Process 600 begins with providing a housing with access ports in one or more external surfaces allowing access into interior from the outside at specified locations based on fin segment length/throw distance of environmental protection process (step 601). With access ports unblocked, electrical conductors used in the environmental protection coating process are connected to both ends of each of the fin segments through the access ports, and the fin segments are coated using the environmental protection process (step 602). Once the environmental protection coating process is complete, the electrical conductors are disconnected from the fin segments and removed through the access ports, and the access ports are then blocked with access port covers configured to block each of the access ports during operation of the air-cooled heat exchanger, to prevent escape of the air through the access ports (step 603). Finally, the air-cooled heat exchanger is placed into operation, drawing air into a housing at an intake, passing that air over surfaces of a set of segmented fins extending within the housing between the intake and at least one outlet, with the air flow directed by the fin segments, preventing escape of the air through access ports with access port covers blocking access ports during operation of the air-cooled heat exchanger, and expelling the air from the at least one outlet in the housing (step 604).

The present disclosure tailors the geometry of high aspect ratio air-cooled heat exchangers to be compatible with robust environmental coating application processes such as electro-coating. Long continuous segments of internal thermal fins are replaced with multiple segments of shorter fins with lengths determined by the environmental coating process throw distance, based on the heat exchanger's aspect ratio. Gaps between fin segments are tailored to heat exchanger aspect ratio, to allow full coverage of environmental protection by the selected coating process. Access ports through the surface of the heat exchanger at key locations along the length of the housing coincide with the gaps between fin segments, allowing the environmental protection processing access to fin segments from both ends. Access port covers maintain airtight flow paths within the heat exchanger.

With the geometry of the present disclosure, environmental protection coatings routinely applied to heat exchangers having short flow lengths and large flow areas (low aspect ratio heat exchangers, a heat exchanger geometry universal in the HVAC industry) may be employed for high-power radar arrays. Alteration of the geometry of a high aspect ratio heat exchanger ensures sufficient environmental protection as compared with chromate conversion coating and other coatings that fail to meet the demands of environmental protection and thermal performance requirements. High-power air cooled radar systems that are thermally efficient are therefore provided with robust environmental protection. The entire heat exchanger design may alternatively be altered to accommodate electro-coating, but with less favorable geometry than the elongate housing described above and thus less than desired performance. Those skilled in the art will understand that tailoring heat exchanger fin geometry to accommodate the electro-coating process may also be applied to other air-cooled heat exchanger designs, avoiding costly and unproven process development.

As noted above, a thermal management system may include one air-cooled heat exchanger with a geometry tailored to the environmental protection coating process, or multiple such heat exchangers, depending on the needs of the overall system being cooled. Moreover, while sporadically described above as being used in connection with a high-power radar system, these heat exchangers may be used in any other suitable thermal management system.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. An air-cooled heat exchanger, comprising:
   a housing having an intake for air flowing through the housing and at least one outlet for the air flowing through the housing;
   a set of segmented fins extending within the housing between the intake and the at least one outlet, the segmented fins configured to direct the air flowing through the housing, each segment of the segmented fins having a length selected based on a throw distance of 15 inches;
   a plurality of access ports extending through at least one wall of the housing and which may be selectively blocked, the access ports located to allow connection of electrical conductors to both ends of each of the fin segments when the access ports are not blocked; and
   access port covers configured to block each of the access ports during operation of the air-cooled heat exchanger.

2. The air-cooled heat exchanger according to claim 1, wherein the housing has a high air flow aspect ratio.

3. The air-cooled heat exchanger according to claim 1, wherein a distance between the intake and the at least one outlet is greater than the throw distance, wherein the throw distance is a maximum distance for an environmental protection coating process employed to apply an environmental protection coating to surfaces of the fin segments.

4. The air-cooled heat exchanger according to claim 1, wherein a gap distance between adjacent ends of two successive ones of the fin segments is 0.25 inches.

5. The air-cooled heat exchanger according to claim 1, wherein each of the segmented fins comprises a plurality of successive fin segments between the intake and the at least one outlet.

6. The air-cooled heat exchanger according to claim 1, wherein a lateral spacing between fin segments at a first location along a length of the housing is greater than a lateral spacing between fin segments at a second location along the length of the housing.

7. The air-cooled heat exchanger according to claim 6, wherein the first location along the length of the housing is closer to the intake than the second location along the length of the housing.

8. The air-cooled heat exchanger according to claim 1, wherein the fins are fully segmented.

9. A high-power radar array including at least first and second air-cooled heat exchangers according to claim 1, wherein the high-power radar array comprises:
   a radar housing within which the first and second air-cooled heat exchangers are mounted.

10. A method of operating an air-cooled heat exchanger, the method comprising:
    drawing air into a housing of the air-cooled heat exchanger at an intake for air flowing through the housing;
    passing the air over surfaces of a set of segmented fins extending within the housing between the intake and at least one outlet, the segmented fins configured to direct the air flowing through the housing, each segment of the segmented fins having a length selected based on a throw distance of 15 inches;
    preventing escape of the air through a plurality of access ports extending through at least one wall of the housing with access port covers configured to block each of the access ports during operation of the air-cooled heat exchanger, the access ports located to allow connection, when the access ports are unblocked, of electrical conductors used in an environmental protection coating process to both ends of each of the fin segments; and
    expelling the air from the at least one outlet in the housing for the air flowing through the housing.

11. The method according to claim 10, wherein the housing has a high air flow aspect ratio.

12. The method according to claim 10, wherein a distance between the intake and the at least one outlet is greater than the throw distance, wherein the throw distance is a maximum distance for the environmental protection coating process employed to apply an environmental protection coating to the surfaces of the fin segments.

13. The method according to claim 10, wherein a gap distance between adjacent ends of two successive ones of the fin segments is 0.25 inches.

14. The method according to claim 10, wherein each of the segmented fins comprises a plurality of successive fin segments between the intake and the at least one outlet.

15. The method according to claim 10, wherein a lateral spacing between fin segments at a first location along a length of the housing is greater than a lateral spacing between fin segments at a second location along the length of the housing.

16. The method according to claim 15, wherein the first location along the length of the housing is closer to the intake than the second location along the length of the housing.

17. The method according to claim 10, wherein the fins are fully segmented.

18. The method according to claim 10, wherein the air-cooled heat exchanger comprises a first air-cooled heat exchanger within a radar housing for a high-power radar array, the method further comprising:

drawing air into a housing of a second air-cooled heat exchanger mounted within the radar housing to cool electronic components mounted in the radar housing in contact with an external surface of at least one of the first and second air-cooled heat exchangers.

19. The air-cooled heat exchanger according to claim 1, wherein the access ports extend through a single wall of the housing.

20. The method according to claim 10, wherein the access ports extend through a single wall of the housing.

* * * * *